United States Patent
Nihashi

(10) Patent No.: US 8,325,473 B2
(45) Date of Patent: Dec. 4, 2012

(54) INFORMATION PROCESSING TERMINAL

(75) Inventor: Kiyotaka Nihashi, Mishima (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 162 days.

(21) Appl. No.: 12/860,508

(22) Filed: Aug. 20, 2010

(65) Prior Publication Data
US 2011/0182024 A1 Jul. 28, 2011

(30) Foreign Application Priority Data
Jan. 27, 2010 (JP) ................................ 2010-015493

(51) Int. Cl.
G06F 1/16 (2006.01)
(52) U.S. Cl. ................ 361/679.33; 360/98.08; 345/173; 248/220.31
(58) Field of Classification Search .................. 360/137, 360/69, 98.08, 92.1, 97.19; 361/679.33, 361/695, 679.32, 679.4, 679.39, 679.55, 361/679.21, 679.31, 679.43, 679.57, 679.34; 345/684, 173, 419, 650; 248/201, 220.21, 248/220.31
See application file for complete search history.

(56) References Cited

U.S. PATENT DOCUMENTS

| | | | |
|---|---|---|---|
| 5,287,244 A | 2/1994 | Hileman et al. | |
| 5,546,272 A | 8/1996 | Moss et al. | |
| 7,742,296 B2 * | 6/2010 | Lai et al. ..................... | 361/679.5 |
| 2005/0037660 A1 | 2/2005 | Chang et al. | |
| 2007/0247809 A1 * | 10/2007 | McClure ....................... | 361/695 |
| 2009/0016037 A1 * | 1/2009 | Chen et al. ................... | 361/810 |
| 2009/0059516 A1 | 3/2009 | Lai et al. | |

FOREIGN PATENT DOCUMENTS

| | | |
|---|---|---|
| JP | 2004282952 | 10/2004 |
| JP | 2005322000 | 11/2005 |
| JP | 2008090772 | 4/2008 |

OTHER PUBLICATIONS

Extended European Search Report for Application No. 10173809.4-1242 issued on Sep. 2, 2011.

* cited by examiner

Primary Examiner — Hung Duong
(74) Attorney, Agent, or Firm — Turocy & Watson, LLP

(57) ABSTRACT

According to one embodiment, an information processing terminal may include a partition wall dividing an inner room of a housing into a first space and a second space. The information processing terminal may further include a support member subdividing the second space into a third space and a fourth space with a ventilation path defined therebetween, the support member supporting the partition wall. Further, the information processing terminal may include a power supply located in the third space defined by the support member, and a mother board configured to allow a processing unit to be mounted thereon in the first space. A cooling fan may be provided in the information processing terminal to have a rotating blade that extends across the first space and the second space defined by the partition wall.

16 Claims, 4 Drawing Sheets

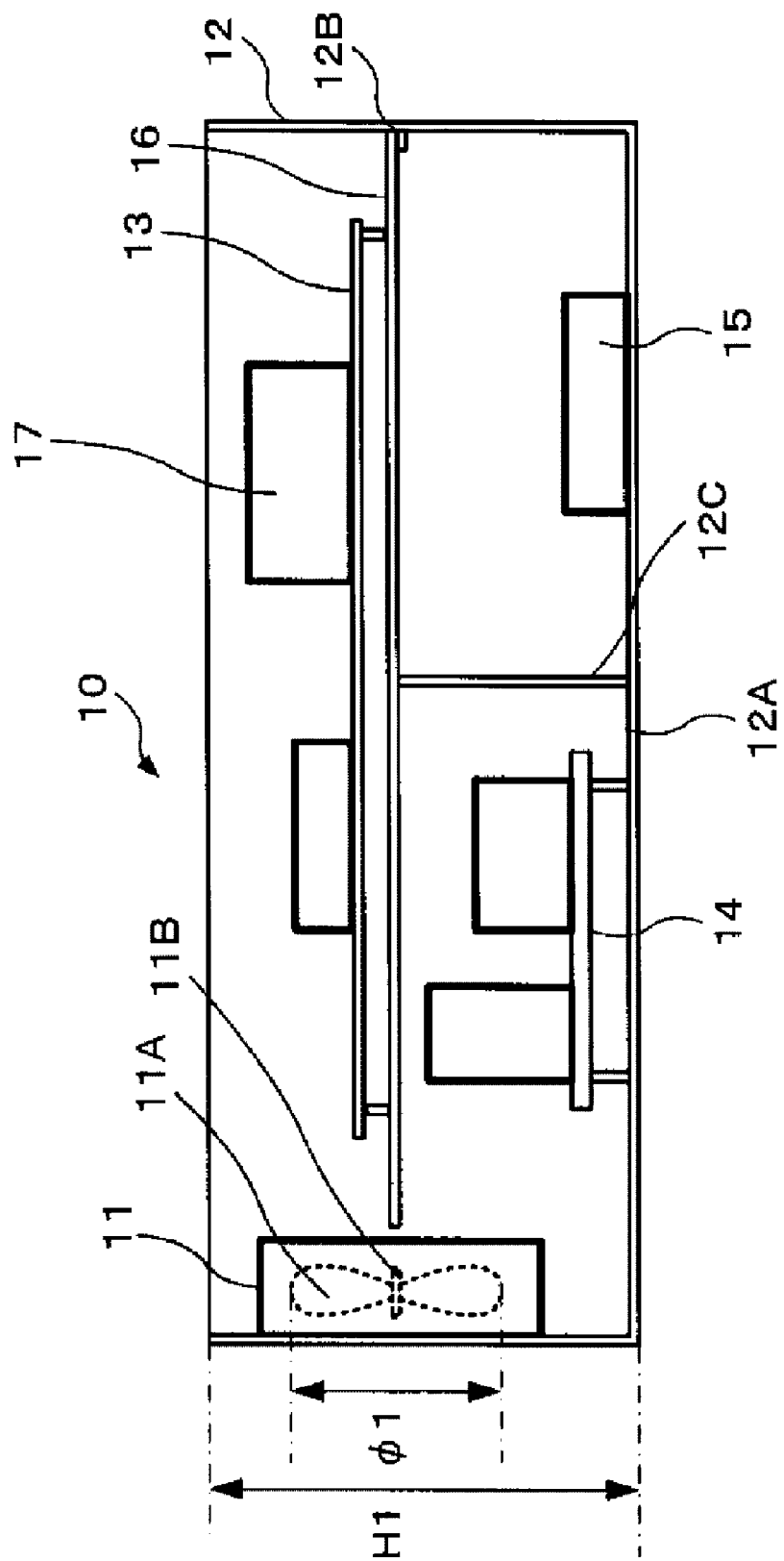

US 8,325,473 B2

INFORMATION PROCESSING TERMINAL

CROSS-REFERENCE TO RELATED APPLICATIONS

This application is based upon and claims the benefit of priority from Japanese Patent Application No. 2010-015493, filed on Jan. 27, 2010, the entire content of which is incorporated herein by reference.

FIELD

Embodiments described herein relate generally to an information processing terminal that may increase cooling efficiency and work efficiency in replacing a mother board.

BACKGROUND

An information processing terminal such as a personal computer or a POS terminal may include a mother board and a power supply in a housing case. An information processing terminal includes a mother board disposed at a lower portion of the housing and a power supply disposed above the mother board. A support member such as a pillar, etc., is necessary to support the power supply due to its own weight. Thus, such an information processing terminal entails a problem in that the power supply and the support member should be detached or removed to replace the mother board, thereby resulting in reduced work efficiency.

In this regard, there has been proposed a technique in which the information processing device includes a housing which is divided into two internal spaces of an upper space and a lower space to arrange the mother board and the power supply respectively.

However, the above technique involves a shortcoming in that since separate cooling fans are required to be mounted at the upper and lower spaces, respectively, a total of two cooling fans are required, thereby leading to an increase in the manufacturing cost.

BRIEF DESCRIPTION OF THE DRAWINGS

FIG. 4 is a front cross-sectional view of an information processing terminal according to a second embodiment.

DETAILED DESCRIPTION

According to one embodiment, an information processing terminal may include a partition wall dividing an inner room of a housing into a first space and a second space; a support member subdiving the second space into a third space and a fourth space with a ventilation path defined between the third space and fourth space. The support member is further configured to support the partition wall. The information processing terminal may further include a power supply disposed in the third space. Further, the information processing terminal may include a mother board configured to allow a processing unit to be mounted thereon in the first space, and a cooling fan having a blade that extends across the first space and the second space defined by the partition wall.

Embodiments of an information processing terminal will now be described in detail with reference to the accompanying drawings.

First Embodiment

Figure 1:
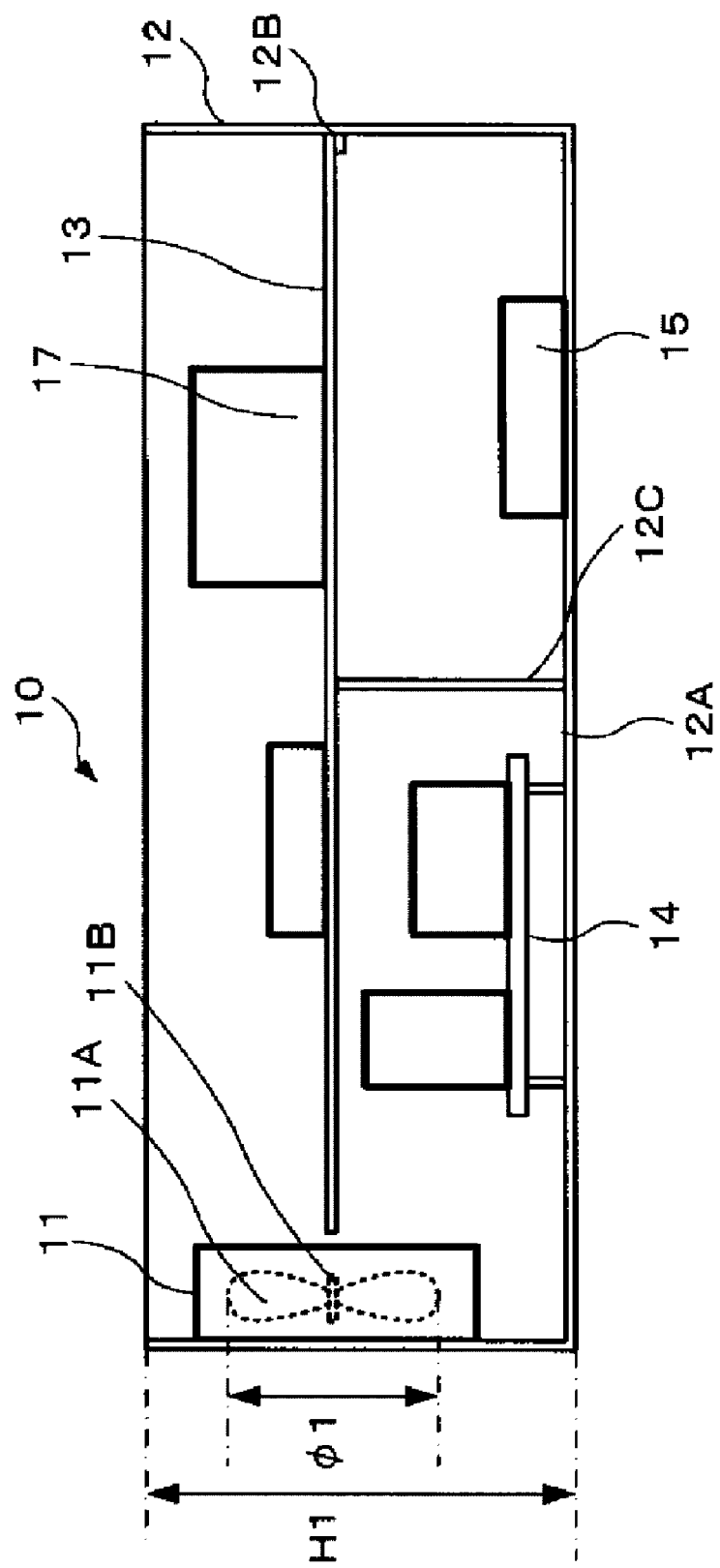
FIG. 1 is a front cross-sectional view of an information processing terminal according to a first embodiment.

FIG. 1 is a front cross-sectional view of an information processing terminal 10 according to a first embodiment. As shown in FIG. 1, the information processing terminal 10 may include, in a housing 12, a mother board 13 configured to mount a processing unit (e.g., CPU 17) and a memory thereon, a power supply 14 configured to supply electric power to the mother board 13, a hard disk drive 15 that serves as a large-capacity storage, and a cooling fan 11 configured to cool the mother board 13 and the power supply 14. Herein, the information processing terminal 10 may include a computer, a personal computer, a POS terminal.

The information processing terminal 10 may include the power supply 14 and the hard disk drive 15 on or above the base plate 12A. A support member 12C is provided on the base plate 12A to support the mother board 13. The housing 12 may include a support projection 12B to mount the mother board 13.

The mother board 13 may serve as a partition wall for dividing an inner room of the housing into a first space and a second space that are an upper space and a lower space, respectively. The mother board 13 serving as a partition wall may function to divide the flow of air generated by the cooling fan 11 into two air streams. The mother board 13 may have an edge which is not in contact with the housing 12. The mother board 13 may allow the CPU 17 to be mounted thereon in the first space of the housing 12.

The support member 12C may serve to subdivide the lower space, which is the second space out of the two internal spaces defined by the mother board 13, into a third space and a fourth space with a ventilation path defined between the third space and fourth space.

The power supply 14 may be installed in the third space and may not have a separate casing, to thereby improve cooling efficiency.

The mother board 13 may be supported by the support member 12C and the support projection 12B. The mother board 13 may be disposed above the power supply 14. When replacing the mother board 13 with a new one, an upper cover of the hosing 12 may be removed and then the mother board 13 may be detached from the housing without detaching the power supply 14.

The cooling fan 11 (e.g., one cooling fan) may be provided at a side wall of the housing 12. The cooling fan 11 is constructed in such a way that a rotation center 11B of a rotating blade 11A thereof is flush with the mother board 13 or is positioned higher than the mother board 13 that serves as a partition wall. This structure increases cooling efficiency of the CPU 17 of the mother board 13.

The cooling fan 11 may be constructed in such a way that the rotating blade 11A thereof is disposed across the first space and the second space defined by the mother board 13.

The diameter $\phi 1$ of the rotating blade 11A of the cooling fan 11 may be set, e.g., to be greater than a half of the height of the housing 12. This is because as the diameter of the rotating blade 11A is increased, the cooling efficiency is improved and sound is reduced.

Figure 2:
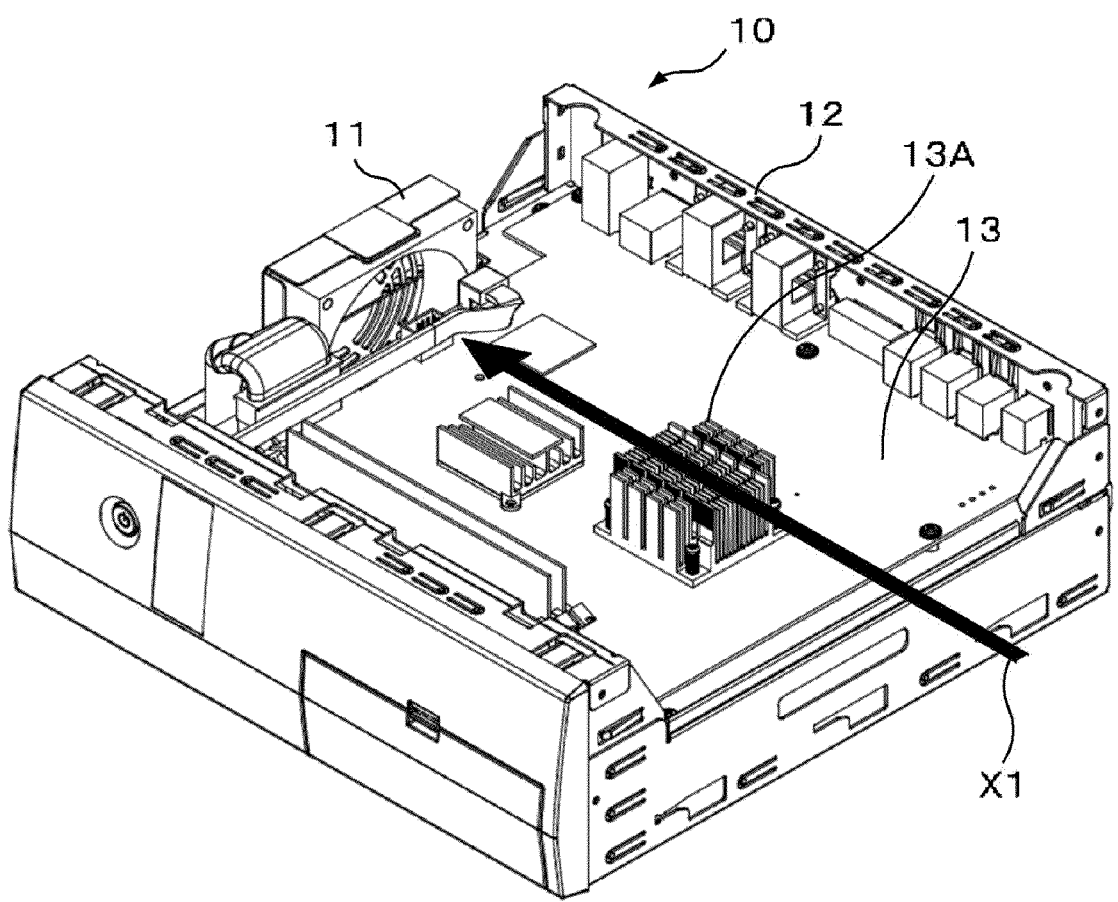
FIG. 2 is a perspective view of an information processing terminal according to the first embodiment with an upper cover of the information processing terminal removed.

FIG. 2 is a perspective view of an information processing terminal according to the first embodiment with an upper cover of the information processing terminal 10 removed. As shown in FIG. 2, in the first space defined by the mother board 13, the flow of air is introduced into the housing 12 in the direction as indicated by an arrow "X1," i.e., from a second side wall of the housing 12 opposite a first side wall thereof on which the cooling fan 11 is mounted, so that it cools a cooling fin 13A of the CPU 17 and is discharged outside of the housing 12 by the cooling fan 11.

Figure 3:
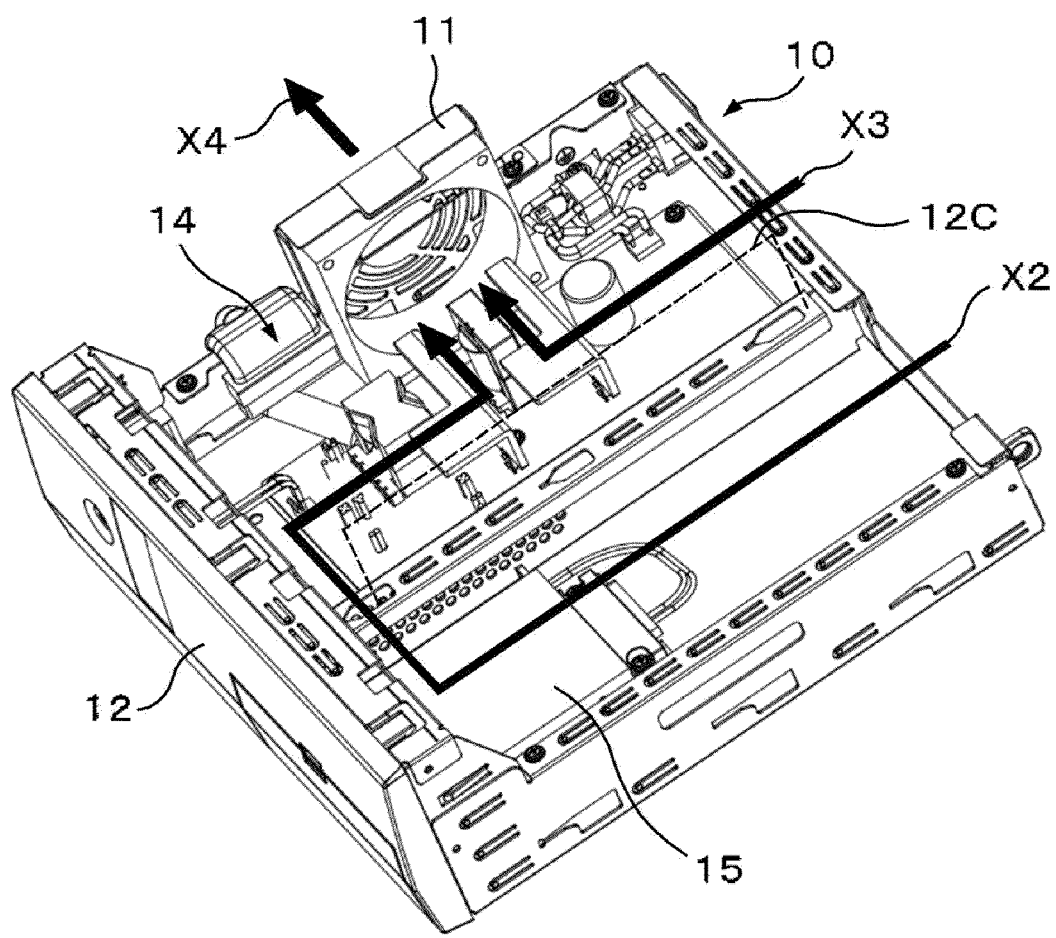
FIG. 3 is a perspective view of an information processing terminal according to the first embodiment with an upper cover and a mother board of the information processing terminal removed.

FIG. 3 is a perspective view of an information processing terminal according to the first embodiment with an upper cover and a mother board of the information processing terminal 10 removed. In FIG. 3, the support member 12C is shown by a dotted line.

As shown in FIG. 3, the lower second space defined by the mother board 13 is subdivided into the third space and the fourth space by the support member 12C. Thus, the flow of air may be divided into a first air stream indicated by an arrow "X2" and a second air stream indicated by an arrow "X3."

The first air stream may be introduced from a rear side of the housing 12, and may cool the hard disk drive 15 and then the power supply 14. Then, the first air stream may be discharged outside of the housing 12 through the cooling fan 11 as indicated by an arrow "X4."

The second air stream may be introduced from the rear side of the housing 12, and may cool the power supply 14. Then, the second air stream may be discharged outside of the housing 12 through the cooling fan 11 as indicated by an arrow "X4."

That is, the support member 12C may support the mother board 13, and contributes to forming the air flow for cooling the hard disk drive 15 and the power supply 14.

The support member 12C can be formed in any shape as long as it can support the mother board 13. Thus, the support member 12C may be in the shape of a wall (e.g., a plate) or in the shape of a pillar.

As described above, the information processing terminal 10 according to the first embodiment may include the power supply 14 disposed on the base plate 12A of the housing 12, and the mother board 13 disposed above the power supply 14 and configured to divide the inner room of the housing into two spaces. The information processing terminal 10 may further include the support member 12C configured to subdivide the lower space defined by the mother board 13 into the third space and the fourth space with the ventilation path defined therebetween, and support the mother board 13. The information processing terminal 10 may further include the cooling fan 11 having a rotating blade 11A that extends across the first space and the second space defined by the mother board 13.

Thus, the information processing terminal 10 may provide the advantages of reducing the number of steps to replace the mother board 13, and cooling both the mother board 13 and the power supply 14 using one cooling fan 11.

Second Embodiment

FIG. 4 is a front cross-sectional view of an information processing terminal 10 according to a second embodiment. As shown in FIG. 4, the information processing terminal 10 includes, in a housing 12, a mother board 13 configured to mount a processing unit (e.g., CPU 17) and a memory thereon, a partition wall 16 configured to mount the mother board 13 thereon, a power supply 14 configured to supply electric power to the mother board 13, a hard disk drive 15 that serves as a large-capacity storage, and a cooling fan 11 configured to cool the mother board 13 and the power supply 14. Herein, the information processing terminal 10 may include a computer, a personal computer, a POS terminal.

The information processing terminal 10 includes the power supply 14 and the hard disk drive 15 supported on or above the base plate 12A. A support member 12C is provided on the base plate 12A to support the partition wall 16. The housing 12 may include a support projection 12B to mount the partition wall 16.

The partition wall 16 may divide an inner room of the housing 12 into a first space and a second space that are an upper space and a lower space, respectively. The partition wall 16 may function to divide the flow of air generated by the cooling fan 11 into two air streams. The partition wall 16 may have an edge which is not in contact with the housing 12. The mother board 13 allows the CPU 17 to be mounted thereon in the first space of the housing 12.

The support member 12C may serve to subdivide the lower space, which is the second space out of the two internal spaces defined by the partition wall 16, into a third space and a fourth space with a ventilation path defined therebetween.

The power supply 14 may be installed in the third space and may not have a separate casing, to thereby improve cooling efficiency.

The partition wall 16 may be supported by the support member 12C and the support projection 12B. The partition wall 16 may allow the mother board 13 to be mounted thereon. The mother board 13 may be fixedly engaged with the partition wall 16 by means of an engagement member such as a screw.

The mother board 13 may be disposed above the power supply 14. If the mother board 13 is replaced with a new one, an upper cover of the housing 12 may be removed and then the mother board 13 may be detached from the housing 12 without detaching the power supply 14.

The cooling fan 11 (e.g., one cooling fan) may be located at a side wall of the housing 12. The cooling fan 11 is constructed in such a way that a rotation center 11B of a rotating blade 11A thereof is flush with the partition wall 16 or is positioned higher than the partition wall 16. This structure may increase cooling efficiency of the CPU 17 of the mother board 13.

The cooling fan 11 may be constructed in such a way that the rotating blade 11A thereof is disposed across the first space and the second space defined by the partition wall 16.

The diameter φ1 of the rotating blade 11A of the cooling fan 11 may be set, e.g., to be greater than a half of the height of the housing 12. This is because as the diameter of the rotating blade 11A is increased, the cooling efficiency is improved and sound is reduced.

The support member 12C can be formed in any shape as long as it can support the partition wall 16. Thus, the support member 12C may be in the shape of a wall (i.e., a plate) or in the shape of a pillar.

As described above, the information processing terminal 10 according to the second embodiment may include the power supply 14 disposed on the base plate 12A of the housing 12, and the partition wall 16 disposed above the power supply 14 and configured to divide the inner room of the housing into two spaces. The information processing terminal 10 may further include the support member 12C configured to subdivide the lower space defined by the partition wall 16 into the third space and the fourth space with the ventilation path defined therebetween, and support the partition wall 16. The information processing terminal 10 may further include the cooling fan 11 having a rotating blade 11A that is disposed across the first space and the second space defined by the partition wall 16.

Thus, the inventive information processing terminal 10 has an advantageous effect in that although the size of the mother board 13 is small, it is possible to cool both the mother board 13 and the power supply 14 by using one cooling fan 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing terminal comprising:
    a partition wall dividing an inner room of a housing into a first space and a second space;
    a support member subdividing the second space into a third space and a fourth space with a ventilation path defined between the third space and the fourth space, the support member supporting the partition wall;
    a power supply located in the third space;
    a mother board configured to allow a processing unit to be mounted thereon in the first space; and
    a cooling fan comprising a rotating blade that extends across the first space and the second space defined by the partition wall.

2. The terminal of claim 1, wherein a rotation center of the rotating blade of the cooling fan is substantially flush with the partition wall or is positioned to the side of the first space higher than the partition wall.

3. The terminal of claim 1, wherein the motherboard functions as the partition wall.

4. The terminal of claim 1, wherein the diameter of the rotating blade of the cooling fan is set to be greater than a half the height of the housing.

5. The terminal of claim 1, further comprising a large-capacity storage, wherein the support member is configured to allow the flow of air for cooling the large-capacity storage and the flow of air for cooling the power supply.

6. The terminal of claim 5, wherein the large-capacity storage includes a hard disk drive.

7. The terminal of claim 1, wherein the flow of air is introduced into the first space of the housing from a second side wall of the housing opposite a first side wall thereof on which the cooling fan is mounted.

8. The terminal of claim 7, wherein the flow of air is discharged to the outside of the housing by the cooling fan.

9. The terminal of claim 1, wherein the flow of air is introduced from a rear side of the housing into the third space and the fourth space to form a first air stream and a second air stream, respectively.

10. The terminal of claim 9, wherein the first air stream cools a hard disk drive and the power supply, and is discharged to the outside of the housing through the cooling fan.

11. The terminal of claim 9, wherein the second air stream cools the power supply, and is discharged outside of the housing through the cooling fan.

12. The terminal of claim 1, wherein the support member is configured to form the air flow for cooling a hard disk drive and the power supply.

13. The terminal of claim 1, wherein the support member is in the shape of a wall or in the shape of a pillar.

14. The terminal of claim 1, further comprising a supporting projection to mount the mother board.

15. The terminal of claim 1, wherein the partition wall functions to divide the flow of air generated by the cooling fan into two air streams.

16. The terminal of claim 1, wherein the information processing terminal comprises any one of a personal computer and a POS terminal.

* * * * *